(12) United States Patent
Kang et al.

(10) Patent No.: US 11,770,130 B2
(45) Date of Patent: Sep. 26, 2023

(54) MIXED-SIGNAL DOT PRODUCT PROCESSOR WITH SINGLE CAPACITOR PER MULTIPLIER

(71) Applicant: INTERNATIONAL BUSINESS MACHINES CORPORATION, Armonk, NY (US)

(72) Inventors: Mingu Kang, Old Tappan, NJ (US); Seyoung Kim, White Plains, NY (US); Seonghoon Woo, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 365 days.

(21) Appl. No.: 16/808,708

(22) Filed: Mar. 4, 2020

(65) Prior Publication Data
US 2021/0279560 A1  Sep. 9, 2021

(51) Int. Cl.
  *H03M 1/66* (2006.01)
  *H03M 1/46* (2006.01)

(52) U.S. Cl.
  CPC .................................. *H03M 1/466* (2013.01)

(58) Field of Classification Search
  CPC .... H03M 1/1245; H03M 1/12; H03M 1/1215; H03M 1/468; H03M 1/804; H03M 1/002; H03M 1/00; H03M 1/144; H03M 1/765; H03M 1/403; H03M 1/124; H03M 1/1225; H03M 1/442; H03M 1/146; H03M 1/1023; H03M 1/0607; H03M 1/802; H03M 1/10; H03M 1/40; H03M 3/496

USPC .................................. 341/122, 172, 144, 150
See application file for complete search history.

(56) References Cited

U.S. PATENT DOCUMENTS

| | | | | |
|---|---|---|---|---|
| 6,529,049 B2 * | 3/2003 | Erhart | .................. | G11C 27/026 327/337 |
| 7,015,729 B1 * | 3/2006 | Tursi | .................... | G11C 27/024 327/94 |
| 7,427,880 B2 * | 9/2008 | Takahashi | ............ | G11C 27/024 327/94 |

(Continued)

OTHER PUBLICATIONS

Bankman, D. et al., "Passive charge redistribution digital-to-analogue multiplier" Electronics Letters (Mar. 2015) pp. 386-388, vol. 51, No. 5.

(Continued)

*Primary Examiner* — Linh V Nguyen
(74) *Attorney, Agent, or Firm* — Tutunjian & Bitetto, P.C.; Randy Emilio Tejeda

(57) ABSTRACT

A mixed-signal logic processor is provided. The mixed-signal logic processor includes a plurality of mixed-signal multiplier branches. Each of the plurality of mixed-signal multiplier branches has a set of branch-dedicated switches and a single branch-dedicated capacitor. The mixed-signal logic further includes a common switch. The common switch is external and common to each of the plurality of mixed-signal multiplier branches. The mixed-signal logic also includes a first shared branch-external capacitor and a second shared branch-external capacitor. The first and the second shared branch-external capacitors are external to and shared by each of the plurality of mixed-signal multiplier branches. Various settings of the set of switches and the common switch enable various modes of the mixed-signal dot product processor.

18 Claims, 8 Drawing Sheets

(56) References Cited

U.S. PATENT DOCUMENTS

| | | | | |
|---|---|---|---|---|
| 7,463,309 | B2* | 12/2008 | Matsuo | H04N 7/035 327/60 |
| 8,106,803 | B2* | 1/2012 | Hurwitz | H03M 1/765 341/172 |
| 8,275,727 | B2 | 9/2012 | Elmegreen et al. | |
| 8,711,982 | B1* | 4/2014 | Cai | H03D 1/18 375/320 |
| 8,836,350 | B2* | 9/2014 | Peter | H03K 17/955 345/173 |
| 8,902,094 | B1* | 12/2014 | Zhang | H03L 7/0814 341/122 |
| 8,902,903 | B2* | 12/2014 | Palchaudhuri | H04W 72/0446 370/406 |
| 9,077,373 | B1* | 7/2015 | Nezuka | H03M 3/398 |
| 9,503,118 | B2 | 11/2016 | Zhang et al. | |
| 9,646,243 | B1 | 5/2017 | Gokmen | |
| 9,793,912 | B1 | 10/2017 | Ferris et al. | |
| 9,960,735 | B1* | 5/2018 | Ding | H03D 7/1441 |
| 10,255,205 | B1 | 4/2019 | Fick et al. | |
| 2006/0071707 | A1* | 4/2006 | Belveze | H03H 15/00 327/554 |
| 2010/0181180 | A1* | 7/2010 | Peter | H03K 17/955 200/600 |
| 2010/0283643 | A1* | 11/2010 | Byrne | H03M 1/1225 341/122 |
| 2016/0248437 | A1 | 8/2016 | Zhang et al. | |
| 2018/0083649 | A1* | 3/2018 | Pernull | H03M 1/0626 |
| 2019/0080231 | A1 | 3/2019 | Nestler et al. | |

OTHER PUBLICATIONS

Kang, M. et al., "An In-Memory VLSI Architecture for Convolutional Neural Networks" IEEE Journal on Emerging and Selected Topics in Circuits and Systems (Sep. 2018) pp. 494-505, vol. 8, No. 3.

Kang, M. et al., "A multi-functional in-memory inference processor using a standard 6T SRAM array" IEEE Journal of Solid-State Circuits (Feb. 2018) pp. 642-655, vol. 53, No. 2.

Li, Y. et al., "Capacitor-based cross-point array for analog neural network with record symmetry and linearity" IEEE Symposium on VLSI Technology (Jun. 2018) pp. 25-26.

El Gamal, A. et al.,"CMOS image sensors" IEEE Circuits and Devices Magazine (May/Jun. 2005) pp. 6-20.

Verma, N. et al., "A micro-power EEG acquisition SoC with integrated seizure detection processor for continuous patient monitoring" IEEE 2009 Symposium on VLSI Circuits (Aug. 2009) pp. 62-63.

Horowitz, M. "1.1 computing's energy problem (and what we can do about it)" 2014 IEEE international solid-state circuits conference digest of technical papers (ISSCC) (Mar. 2014) pp. 10-14.

Choi, J. et al., "An energy/illumination-adaptive CMOS image sensor with reconfigurable modes of operations" IEEE Journal of Solid-State Circuits 50.6 (Jun. 2015) pp. 1438-1450, vol. 50, No. 6.

Delagnes, E. et al., "A low power multi-channel single ramp ADC with up to 3.2 GHz virtual clock" 2006 IEEE Nuclear Science Symposium Conference Record (Oct. 2006) pp. 231-238, vol. 1.

* cited by examiner

MIXED-SIGNAL DOT PRODUCT PROCESSOR WITH SINGLE CAPACITOR PER MULTIPLIER

BACKGROUND

The present invention generally relates to processing devices, and more particularly to a mixed-signal dot product processor with a single capacitor per multiplier. Emerging sensor-rich platforms often demand local decision making capability using Machine Learning (ML) algorithms. Those platforms can require expensive Analog-to-Digital Conversion (ADC) as the sampled data is in analog domain. Not only the sensor applications, but also many emerging computing platforms such as in-memory computing, neuromorphic computing (e.g., Resistive Random Access Memory (ReRAM) based computing) often generate intermediate results in analog domain. Therefore, analog & digital mixed-signal processing is a good alternative to avoid such high costs from ADC. The key computing kernel of most machine learning algorithms is dot product, which is a sum of many multiplications. Naturally, mixed signal multiplication between analog value (from sensor or neuromorphic computing block) and digital value (from memory) is an essential computing component. Thus, there is a need for an efficient computing device for dot product or other logic computations.

SUMMARY

According to an aspect of the present invention, a mixed-signal logic processor is provided. The mixed-signal logic processor includes a plurality of mixed-signal multiplier branches. Each of the plurality of mixed-signal multiplier branches has a set of branch-dedicated switches and a single branch-dedicated capacitor. The mixed-signal logic processor further includes a common switch. The common switch is external and common to each of the plurality of mixed-signal multiplier branches. The mixed-signal logic processor also includes a first shared branch-external capacitor and a second shared branch-external capacitor. The first and the second shared branch-external capacitors are external to and shared by each of the plurality of mixed-signal multiplier branches. Various settings of the set of switches and the common switch enable various modes of the mixed-signal dot product processor.

According to another aspect of the present invention, a method is provided for forming mixed-signal dot product processor. The method includes arranging a plurality of mixed-signal multiplier branches to each have a set of branch-dedicated switches and a single branch-dedicated capacitor. The method further includes connecting a common switch external from and common to each of the plurality of mixed-signal multiplier branches. The method also includes sharing a first shared branch-external capacitor and a second shared branch-external capacitor by each of the plurality of mixed-signal multiplier branches. Various settings of the set of switches and the common switch enable various modes of the mixed-signal dot product processor.

According to yet another aspect of the present invention, a computer processing system is provided. The computer processing system includes a mixed-signal logic processor. The mixed-signal logic processor includes a plurality of mixed-signal multiplier branches, each having a set of branch-dedicated switches and a single branch-dedicated capacitor. The mixed-signal logic processor further includes a common switch, the common switch being external and common to each of the plurality of mixed-signal multiplier branches. The mixed-signal logic processor also includes a first shared branch-external capacitor and a second shared branch-external capacitor. The first and the second shared branch-external capacitors are external to and shared by each of the plurality of mixed-signal multiplier branches. Various settings of the set of switches and the common switch enable various modes of the mixed-signal logic processor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to a mixed-signal dot product processor with a single capacitor per multiplier.

Embodiments of the present invention avoid incurring the high costs of using an Analog-to-Digital Converter (ADC) in order to perform a mixed-signal dot product computation.

As the key computer kernel of most machine learning algorithms is dot product, which is a sum of many multiplications, the present invention has particular is such machine learning algorithms and similar applications.

While the present invention is essentially directed to the use of mixed-signal dot product, the present invention can be readily adapted to compute other logic operations including, but limited to, cross product and so forth.

Figure 1:
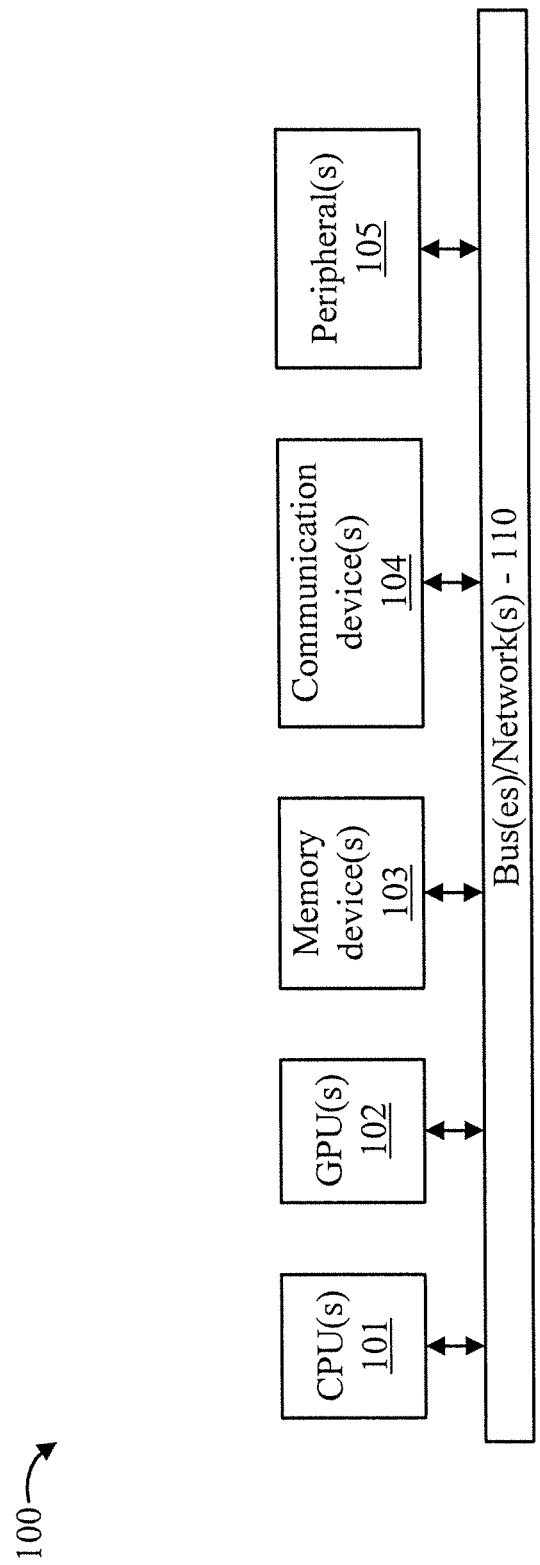
FIG. 1 is a block diagram showing an exemplary processing system 100, in accordance with an embodiment of the present invention.

FIG. 1 is a block diagram showing an exemplary processing system 100, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. At least one of the CPUs 101 and/or the GPUs 102 include a mixed-signal dot processor with a single capacitor per multiplier. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Figure 2:
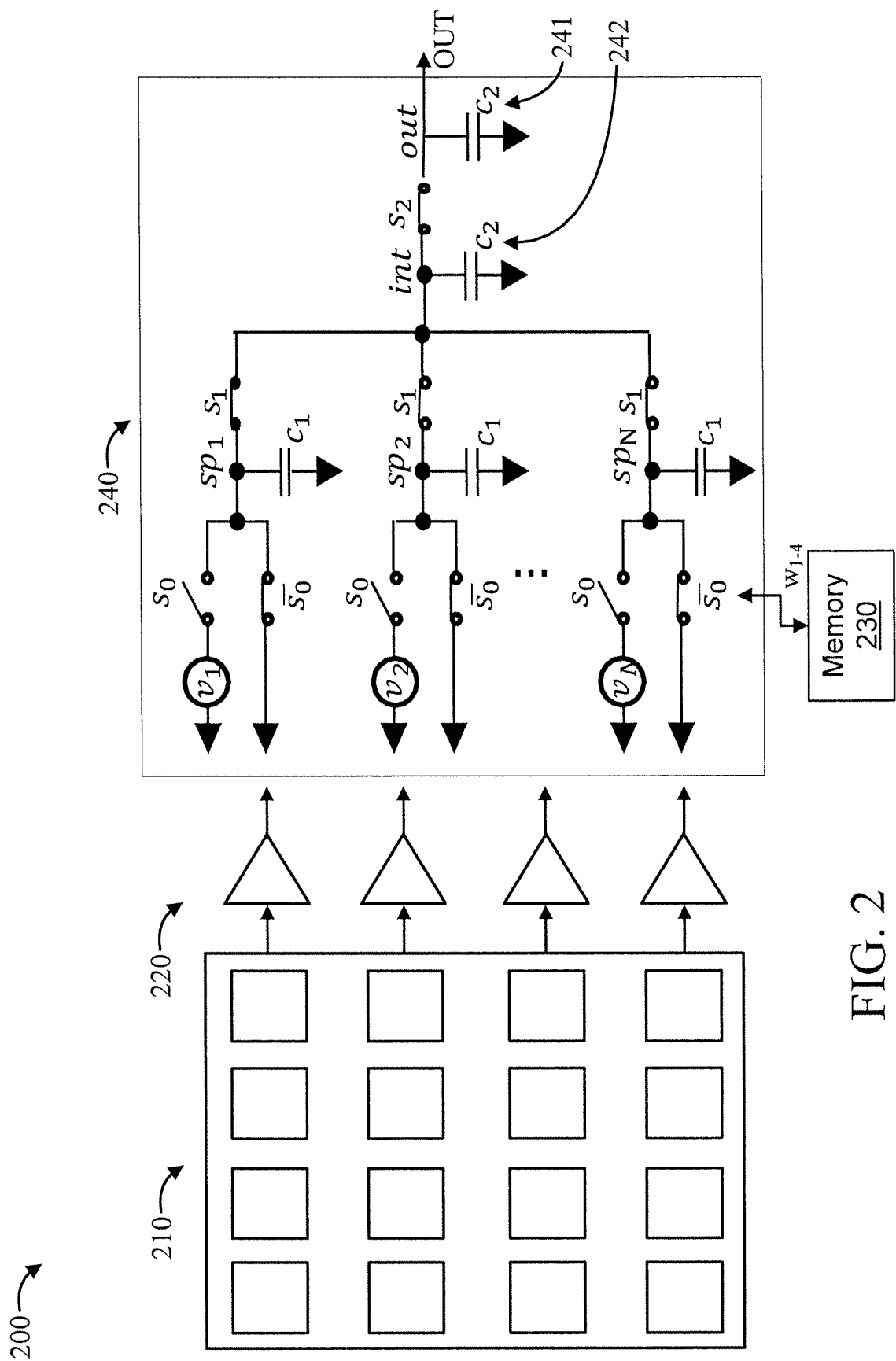
FIG. 2 is a block diagram showing an exemplary mixed-signal dot product computation 200, in accordance with an embodiment of the present invention.

FIG. 2 is a block diagram showing an exemplary mixed-signal dot product computation 200, in accordance with an embodiment of the present invention.

The computation 200 involves an array 210 of sensor nodes. While a particular number of sensor nodes is shown in the array, in other embodiments, other numbers of sensor nodes can be used while maintaining the spirit of the present invention.

The computation 200 further involves a set of amplifiers 220. While a particular number of amplifiers is shown in the set, in other embodiments, other numbers of amplifiers can be used while maintaining the spirit of the present invention.

The computation 200 also involves a memory device 230.

The computation 200 additionally involves a dot product computation portion (interchangeably referred to as "dot product processor") 240.

The dot product computation portion 240 includes a capacitor $c_2$ 241, a capacitor $c_2$ 242, and a switch $s_2$.

The dot product computation portion 240 further includes "branches" 1 through N, where each branch includes a switch $s_0$, a switch $\overline{s_0}$, a capacitor $c_1$, and a switch $s_1$. Each branch further includes a respective input voltage, $v_1$ through $v_N$, and a respective (capacitor $c_1$) node voltage, $sp_1$ through $sp_N$.

In an embodiment, the proposed mixed-signal dot product processor computes the inner product as follows:

$$\vec{x}\cdot\vec{w}=x_1w_1+x_2w_2+\ldots+x_Nw_N,$$

where $\vec{x}=[x_1\ x_2\ \ldots\ x_N]$, $\vec{w}=[w_1\ w_2\ \ldots\ w_N]$, $x_n$s are analog inputs, and $w_n$s are B-bit digital values, i.e.:

$$w_n=w_{n,0}+2w_{n,1}+\ldots+2^{B-1}w_{n,B-1},$$

where $w_{n,b}\in\{0,1\}$: n-th element's b-th bit

The multiplication between analog value $x_n$ and B-bit digital value $w_n$ uses the only single capacitor. The analog value can be from a sensor or a neuromorphic computing block, while the digital value can be from a memory device.

For an 8-bit digital value, the proposed multiplier requires about a 256× smaller capacitor area and lower energy consumption to charge the capacitors.

The dot product computation is processed based on following mathematic transformation: When B=8 bit, then $$\vec{x}\cdot\vec{w}=\sum_{n=1}^{N}\left(w_{n,0}+2w_{n,1}+\ldots 2^7w_{n,7}\right)x_n=$$
$$2^8\left\{0.5\sum_{n=1}^{N}w_{n,7}x_n+\ldots+0.5^7\sum_{n=1}^{N}w_{n,1}x_n+0.5^8\sum_{n=1}^{N}w_{n,0}x_n\right\}$$

where the notations following $2^8$ in the preceding line are computed by the proposed dot-product processor.

FIGS. 3-6 are block diagrams showing exemplary processing stages of the dot processor 240 of FIG. 2, in accordance with various embodiments of the present invention. The various processing stages include (i) a reset and (ii) subsequent B evaluation stages, where each of the B evaluation stages include a reset stage, a sample stage, a merge stage, and an accumulate stage. In FIGS. 3-6, $sp_n$ denotes a sampled voltage of capacitor $c_1$, int denotes the merged voltage of N sampled voltages on capacitor $c_1, \ldots, c_N$ by merge stage, and out denotes the accumulated voltage from 0 to (b−1)-th bit position after b evaluation stages.

Figure 3:
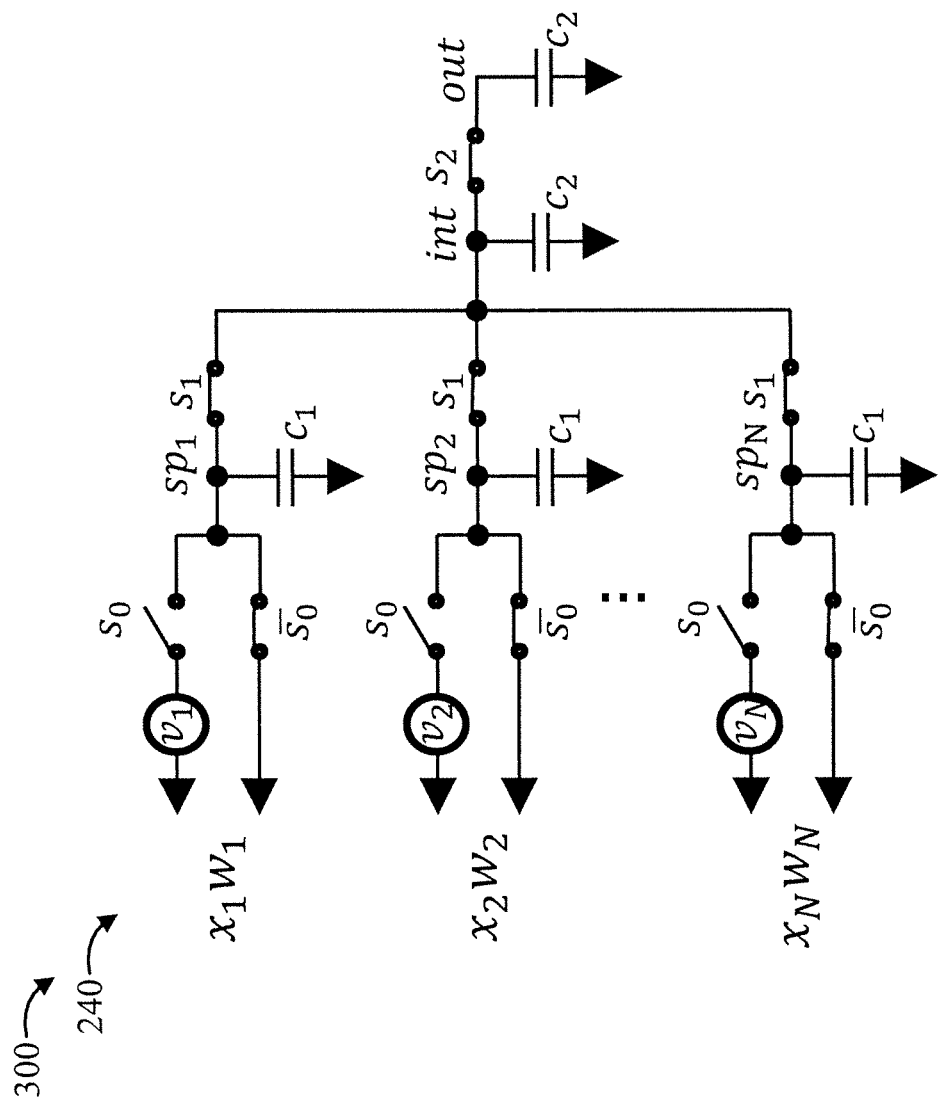
FIG. 3 is a block diagram showing an exemplary reset stage of the dot processor of FIG. 2, in accordance with an embodiment of the present invention.

FIG. 3 is a block diagram showing an exemplary reset stage 300 of the dot processor 240 of FIG. 2, in accordance with an embodiment of the present invention.

In the reset stage 300, the switches $s_0$ of each of the branches are open, the switches $\overline{s_0}$ of each of the branches are closed, the switches $s_1$ of each of the branches are closed, and (common) switch $s_2$ is closed. $v_n$ denotes the input voltage corresponding to $x_n$.

Figure 4:
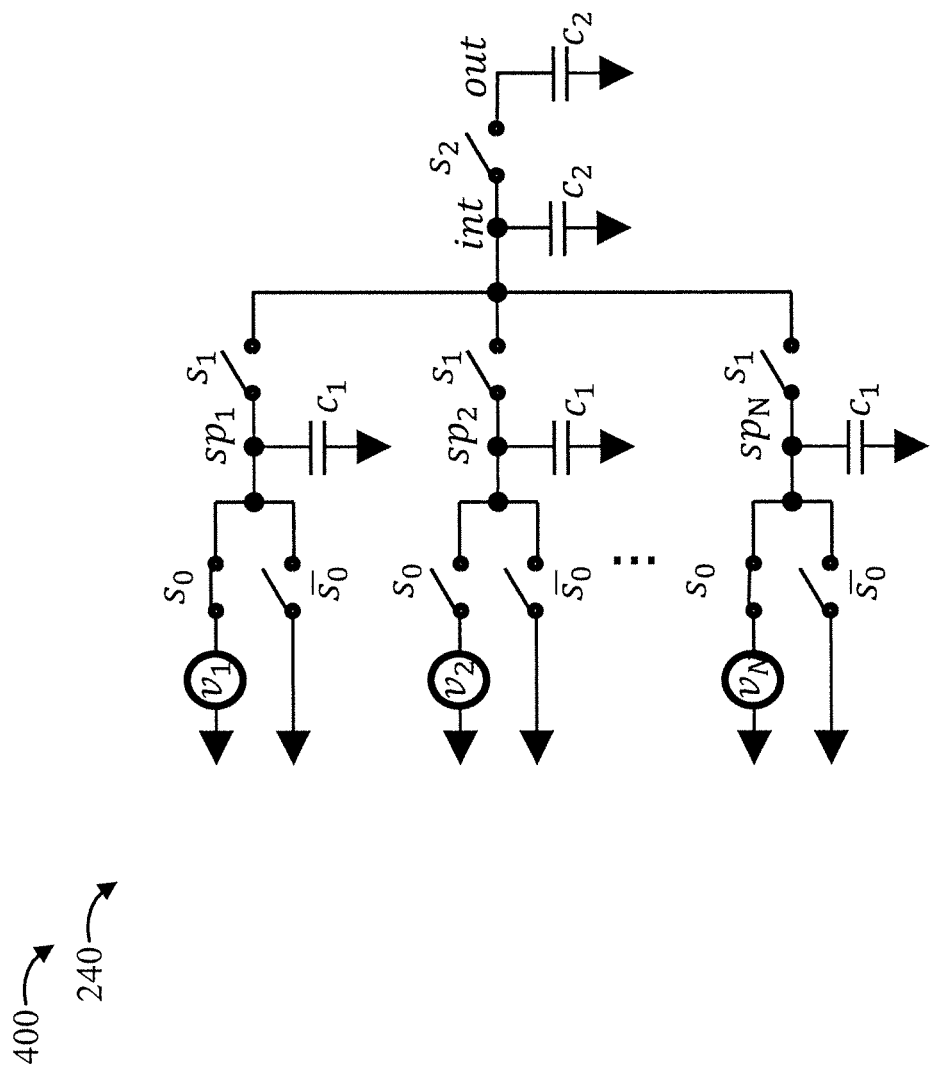
FIG. 4 is a block diagram showing an exemplary sample stage of the dot processor of FIG. 2, in accordance with an embodiment of the present invention.

FIG. 4 is a block diagram showing an exemplary sample stage 400 of the dot processor 240 of FIG. 2, in accordance with an embodiment of the present invention.

In the sample stage 400, the switches $s_0$ of each of the branches are closed except for an active one of the branches, the switches $\overline{s_0}$ of each of the branches are open, the switches $s_1$ of each of the branches are open, and (common) switch $s_2$ is open. In the sample stage 400, $w_{1,b}=1$, $w_{2,b}=0$, and $W_{N,b}=1$.

Figure 5:
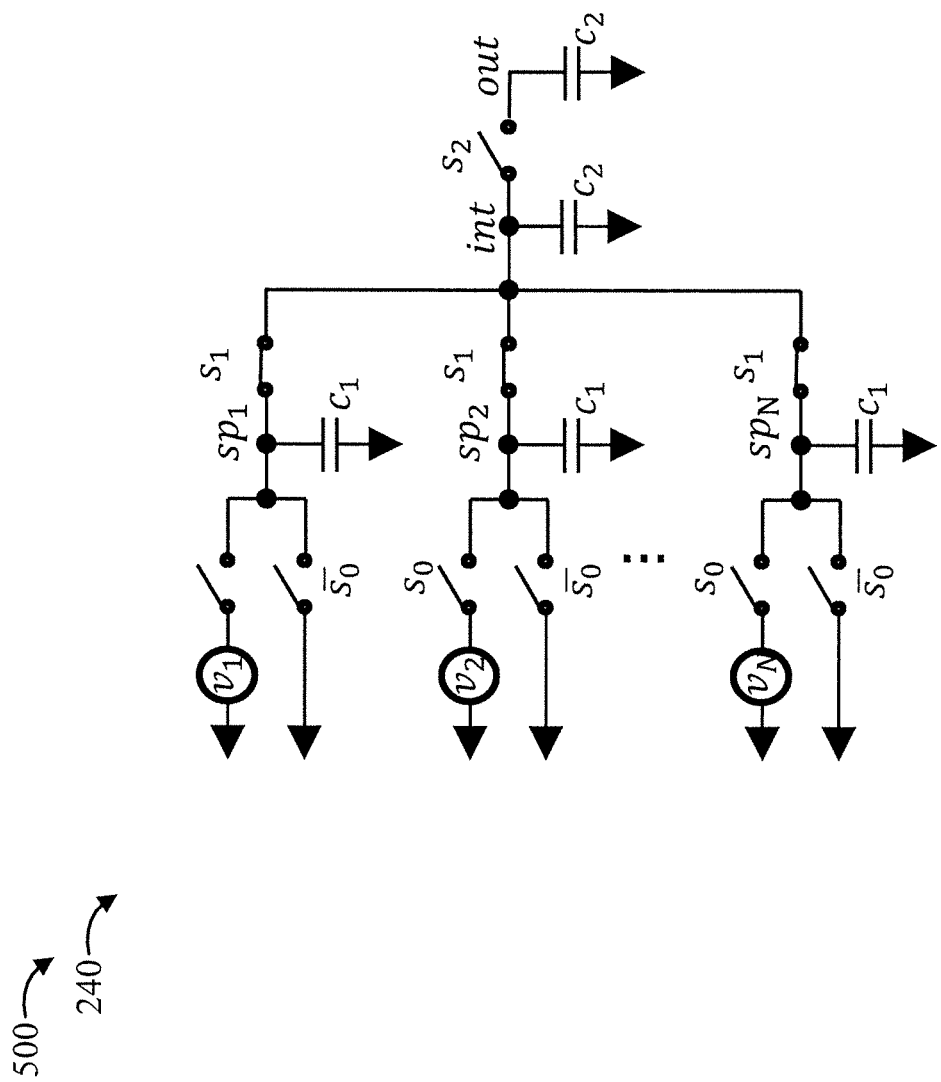
FIG. 5 is a block diagram showing an exemplary merge stage of the dot processor of FIG. 2, in accordance with an embodiment of the present invention.

FIG. 5 is a block diagram showing an exemplary merge stage 500 of the dot processor 240 of FIG. 2, in accordance with an embodiment of the present invention.

In the merge stage 500, the switches $s_0$ of each of the branches are open, the switches $\overline{s_0}$ of each of the branches are open, the switches $s_1$ of each of the branches are closed, and (common) switch $s_2$ is open. Regarding capacitor sizing (described in more detail hereinbelow), in an embodiment, $N*C_1 \gg C_2$.

Figure 6:
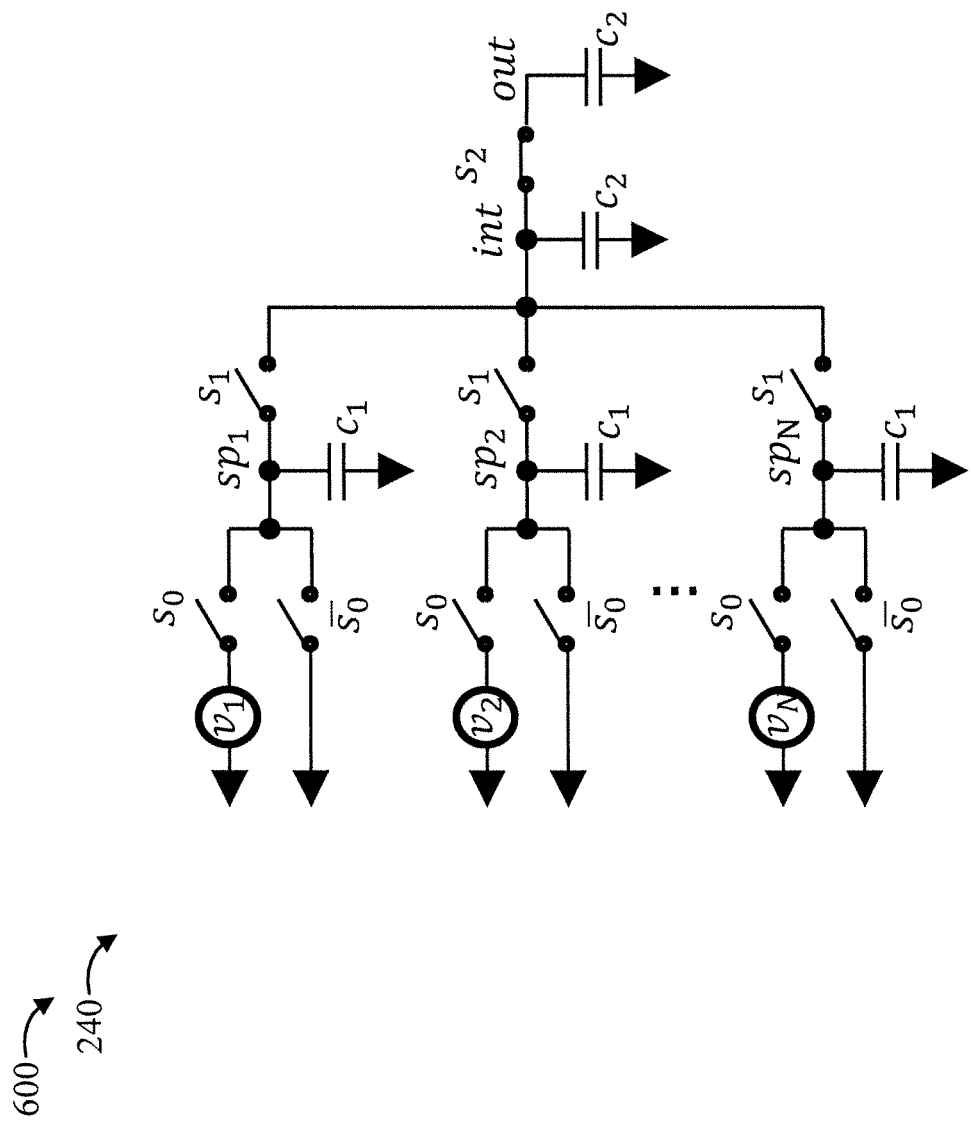
FIG. 6 is a block diagram showing an exemplary accumulate stage of the dot processor of FIG. 2, in accordance with an embodiment of the present invention.

FIG. 6 is a block diagram showing an exemplary accumulate stage 600 of the dot processor 240 of FIG. 2, in accordance with an embodiment of the present invention.

In the accumulate stage 600, the switches $s_0$ of each of the branches are open, the switches $\overline{s_0}$ of each of the branches are open, the switches $s_1$ of each of the branches are open, and (common) switch $s_2$ is closed.

TABLE 1 is a table showing signals relating to the various processing stages of the dot product processor of the present invention, in accordance with an embodiment of the present invention.

TABLE 1

| $X_n$ | Phase | $s_0$ | $\overline{s_0}$ | $s_1$ | $s_2$ | $v_{sp,n}$ | $v_{int}$ | $v_{out}$ |
|---|---|---|---|---|---|---|---|---|
|  | reset | 0 | 1 | 1 | 1 | 0 | 0 | 0 |
| b = 0 | sample | $b_0$ | $\overline{b_0}$ | 0 | 0 | $w_{n,0}v_n$ | 0 | 0 |
|  | merge | 0 | 0 | 1 | 0 | $w_{n,0}v_n$ | $\sum_{n=1}^{N} w_{n,0}v_n$ | 0 |
|  | accumulation | 0 | 0 | 0 | 1 | $w_{n,0}v_n$ |  | $0.5\sum_{n=1}^{N} w_{n,0}v_n$ |
| b = 1 | sample | $b_1$ | $\overline{b_1}$ | 0 | 0 | $w_{n,1}v_n$ |  | $0.5\sum_{n=1}^{N} w_{n,0}v_n$ |
|  | merge | 0 | 0 | 1 | 0 | $w_{n,1}v_n$ | $\sum_{n=1}^{N} w_{n,1}v_n$ | $0.5\sum_{n=1}^{N} w_{n,0}v_n$ |
|  | accumulation | 0 | 0 | 0 | 1 | $w_{n,1}v_n$ |  | $0.5\sum_{n=1}^{N} w_{n,1}v_n + 0.5^2\sum_{n=1}^{N} w_{n,0}v_n$ |
| ... | ... |  |  |  |  | ... |  |  |
| b = 7 | sample | $b_7$ | $\overline{b_1}$ | 0 | 0 | $w_{n,7}v_n$ | ... | ... |
|  | merge 00 | 0 | 0 | 1 | 0 | $w_{n,7}v_n$ | $\sum_{n=1}^{N} w_{n,7}v_n$ | ... |
|  | accumulation | 0 | 0 | 0 |  | $w_{n,7}v_n$ |  | $0.5\sum_{n=1}^{N} w_{n,7}v_n + 0.5^7\sum_{n=1}^{N} w_{n,1}v_n + 0.5^8\sum_{n=1}^{N} w_{n,0}v_n$ |

Figure 7:
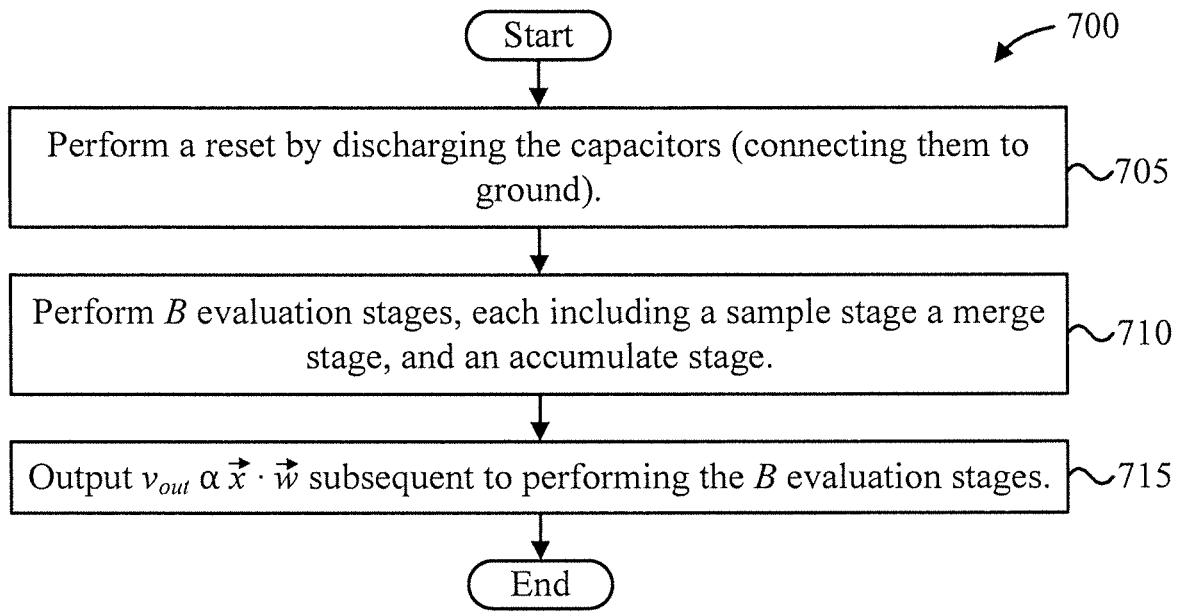
FIG. 7 is a flow diagram showing an exemplary dot product computation method, in accordance with an embodiment of the present invention.

FIG. 7 is a flow diagram showing an exemplary dot product computation method 700, in accordance with an embodiment of the present invention.

At block 705, perform a reset by discharging the capacitors (connecting them to ground). In another embodiment, the capacitors can be discharged by connected then to a discharging potential.

At block 710, perform B evaluation stages, each including a sample stage a merge stage, and an accumulate stage. Thus, for a b-th evaluation stage (for B-bit value W, this stage is iterated by B times), the following applies:

(a) sample: samples the analog input voltage $V_n$ into capacitor $c_1$ by closing the switch $s_0$ such that
if b-th bit $w_{n,b}=1$, then sampling node $sp_n$ has a voltage $w_{n,b}v_n$.
if $w_{n,b}=0$, then the charge at node $sp_n$ is removed by closing the switch $\overline{s_0}$.

(b) N $sp_n$ nodes are charge-shared to sum up the N elements and the charge is transferred to the int node. Here, the capacitance $N*C_1 \gg C_2$. Thus, there is almost no voltage drop during the transfer.

(c) accumulation: the nodes $sp_n$'s and out are charge-shared.

At block 715, output $v_{out} \propto \vec{x} \cdot \vec{w}$ subsequent to performing the B evaluation stages.

A description will now be given regarding sizing $c_1$ and $c_2$, in accordance with an embodiment of the present invention.

(1) Rule 1: $N*C_1 \gg C_2$ (e.g., $N*C_1=10C_2$).

Note the N $C_1$ capacitors' charge is dumped on $C_2$ capacitor passively.

Thus, there is voltage drop during the dumping.

For example, in the first cycle with b=0, "Vint=Vmerge*N*C1/(N*C1+C2)", where $$v_{merge} = \sum_{n=1}^{N} w_{n,0} v_n.$$

Thus, ideal condition is $N*C_1 \gg C_2$, where there might be negligible voltage drop.

(2) Rule 2: $C_2$ should not be too small (e.g., >100 fF with N=64)

On the other hand, if $C_2$ is too small, the switching activity of many (N) S1 switches will generate coupling noise on the int node, thereby degrading the computing accuracy.

Therefore, $C_2$ should have a large enough size.

(3) Example $C_1$=20 fF, $C_2$=200 fF, N=64

In this case, the voltage drop is only about <12% during the charge dumping while maintaining the accuracy by having enough tolerance from the coupling noise.

Figure 8:
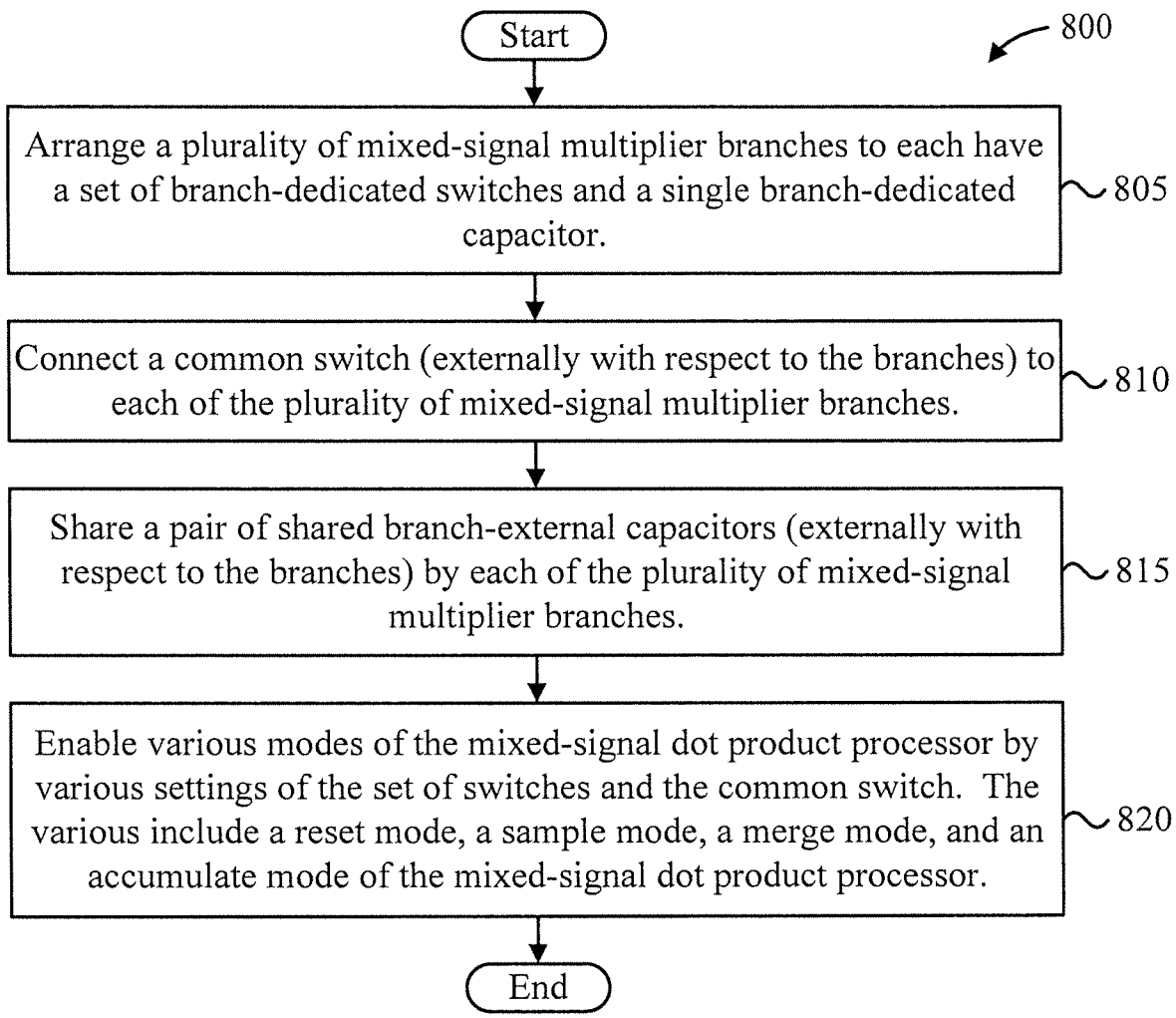
FIG. 8 is a flow diagram showing an exemplary method for forming and operating a mixed-signal dot product processor, in accordance with an embodiment of the present invention.

FIG. 8 is a flow diagram showing an exemplary method 800 for forming and operating a mixed-signal dot product processor, in accordance with an embodiment of the present invention.

At block 805, arrange a plurality of mixed-signal multiplier branches to each have a set of branch-dedicated switches and a single branch-dedicated capacitor.

At block 810, connect a common switch (externally with respect to the branches) to each of the plurality of mixed-signal multiplier branches.

At block 815, share a pair of shared branch-external capacitors (externally with respect to the branches) by each of the plurality of mixed-signal multiplier branches.

At block 820, enable various modes of the mixed-signal dot product processor by various settings of the set of switches and the common switch. The various include a reset mode, a sample mode, a merge mode, and an accumulate mode of the mixed-signal dot product processor.

The present invention advantageously uses a single capacitor within each of the branches, while sharing 2 capacitors outside the branches, in order to avoid multiple capacitors within each of the branches, thus consuming a smaller area and using small capacitors that can be quickly charged.

TABLE 2 shows a summary of benefits of the proposed multiplier verses a conventional digital implementation for a 8-b case, in accordance with an embodiment of the present invention. The items that were evaluated included area, delay, and energy.

TABLE 2

| 8-b case | Conventional digital implementation | Proposed multiplier | Gain |
|---|---|---|---|
| area | 3400 um$^2$ (dominated by ADC) [a] | 14 um$^2$ [b] | 240× |
| delay | 140 ns (dominated by ADC) [c] | 1 ns * (2 * 8 + 2) = 18 ns [d] | 7.8× |
| energy | 0.2 pJ [e] + 0.2 pJ [f] = 0.4 pJ | cu(=20 fF) * $V_{dd}^2$(= 1 V) = 20 fJ [g] | 20× |

Thus, in relation to the footnotes (a) through (g) in TABLE 2, the following benefits apply to the present invention versus conventional digital implementations:
[a] per-column ADC area (for CMOS image sensor) extracted from silicon die micrograph;
[b] Extracted from silicon die area for 25-fF capacitors + switches;
[c] Single ramp ADC (most widely used as per-column ADC) 8-b conversion delay;
[d] 25 fF capacitors can be charged within 1 ns:
2*8: sampling (+1) and accumulation stage (+1) = 2, and 8 such iterations for 8-b data
2: for reset phase
[e] Single ramp ADC (most widely used as per-column ADC) energy per 8-b conversion;
[f] 8-b fixed-point multiplier energy; and
[g] 20 fF sampling capacitor's charging energy dominates the total energy consumption.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A mixed-signal logic processor, comprising:
a dot product computation portion having a plurality of mixed-signal multiplier branches, each of the plurality of mixed-signal multiplier branches connected to a single common node, and each of the plurality of mixed-signal multiplier branches having a set of branch-dedicated switches and a single branch-dedicated capacitor where each branch has a different voltage level, the set including two switches connected in parallel, wherein the dot product computation portion further includes:
a common switch being external to each of the plurality of mixed-signal multiplier branches; and
a first shared branch-external capacitor and a second shared branch-external capacitor positioned directly on opposed ends of the common switch without any other electrical connections therebetween, the first and the second shared branch-external capacitors being external to each of the plurality of mixed-signal multiplier branches such that only the first shared branch-external capacitor directly connects to the single common node connecting all of the plurality of mixed-signal multiplier branches,
wherein various settings of the set of switches and the common switch enable various modes of the mixed-signal logic processor comprising a reset mode, a sample mode, a merge mode, and an accumulate mode for a dot product computation.

2. The mixed-signal logic processor of claim 1, wherein the first shared branch-external capacitor and the second shared branch-external capacitor are parallel to each other.

3. The mixed-signal logic processor of claim 1, wherein the mixed-signal logic processor is configured to compute a dot product between an analog value vector and a digital value vector.

4. The mixed-signal logic processor of claim 3, wherein the mixed-signal logic processor is comprised in a system having at least one sensor and a memory device, wherein the analog value vector is received from the at least one sensor and the digital value vector is received from the memory device.

5. The mixed-signal logic processor of claim 3, wherein an inner product of the mixed-signal logic processor is given as:

$$\vec{x} \cdot \vec{w} = x_1 w_1 + x_2 w_2 + \ldots + x_N w_N,$$

where $\vec{x} = [x_1\ x_2\ \ldots\ x_N]$, $\vec{w} = [w_1\ w_2\ \ldots\ w_N]$, $x_n$s are analog inputs, and $w_n$s represents B-bit digital values, that is:

$$w_n = w_{n,0} + 2 w_{n,1} + \ldots + 2^{B-1} w_{n,B-1},$$

where $w_{n,b} \in \{0,1\}$: n-th element's b-th bit.

6. The mixed-signal logic processor of claim 1, wherein the single branch-dedicated capacitor in each of the plurality of mixed-signal multiplier branches is of a same size.

7. The mixed-signal logic processor of claim 1, wherein the set of branch-dedicated switches include a first switch and a second switch, each having a first side connected to one side of the single branch-dedicated capacitor, wherein another side of the first switch is connected to an input voltage, and the another side of the second switch bypasses the input voltage.

8. The mixed-signal logic processor of claim 7, wherein the set of branch-dedicated switches include a third switch having a first side connected to the one side of the branch-dedicated capacitor and a second side connected to a common node with respect to each of the plurality of mixed-signal multiplier branches.

9. The mixed-signal logic processor of claim 1, wherein capacitor-wise each of the plurality of mixed-signal multiplier branches include only the single branch-dedicated capacitor.

10. The mixed-signal logic processor of claim 1, wherein the various modes of the mixed-signal logic processor comprise a reset mode, a sample mode, a merge mode, and an accumulate mode.

11. A method for forming a mixed-signal logic processor, comprising:
   forming a dot product computation portion by arranging a plurality of mixed-signal multiplier branches to each have a set of branch-dedicated switches and a single branch-dedicated capacitor, each of the plurality of mixed-signal multiplier branches connected to a single common node and each branch having a different voltage level, and the set comprising two switches connected in parallel, wherein the dot product computation portion further comprises:
   connecting a common switch external to each of the plurality of mixed-signal multiplier branches; and
   positioning the common switch between a first shared branch-external capacitor and a second shared branch-external capacitor such that only the first shared branch-external capacitor directly connects to the common single node connecting all of the plurality of mixed-signal multiplier branches;
   wherein various settings of the set of switches and the common switch enable various modes of the mixed-signal logic processor comprising a reset mode, a sample mode, a merge mode, and an accumulate mode for a dot product computation.

12. The method of claim 11, wherein the first shared branch-external capacitor and the second shared branch-external capacitor are parallel to each other.

13. The method of claim 11, further comprising configuring the mixed-signal logic processor to compute a dot product between an analog value vector and a digital value vector.

14. The method of claim 13, wherein the mixed-signal logic processor is comprised in a system having at least one sensor and a memory device, and wherein the method further comprising receiving the analog value vector from the at least one sensor and receiving the digital value vector from the memory device.

15. The method of claim 13, further comprising configuring the sample mode to sample the analog value vector using the single branch-dedicated capacitor in each of the plurality of mixed-signal multiplier branches to store a sample value.

16. The method of claim 11, wherein an inner product of the mixed-signal logic processor is given as:

$$\vec{x} \cdot \vec{w} = x_1 w_1 + x_2 w_2 + \ldots + x_N w_N,$$

where $\vec{x} = [x_1 \, x_2 \ldots x_N]$, $\vec{w} = [w_1 \, w_2 \ldots w_N]$, $x_n$s are analog inputs, and $w_n$s represents B-bit digital values, that is:

$$w_n = w_{n,0} + 2 w_{n,1} + \ldots + 2^{B-1} w_{n,B-1},$$

where $w_{n,b} \in \{0,1\}$: n-th element's b-th bit.

17. The method of claim 11, wherein the set of branch-dedicated switches include a first switch and a second switch, and the method further comprises:
   connecting a first side of the first switch and the second switch to one side of the single branch-dedicated capacitor;
   connecting a second side of the first switch is connected to an input voltage; and
   bypassing the input voltage by a seconds side of the second switch.

18. A computer processing system, comprising:
   a mixed-signal logic processor, wherein the mixed-signal logic processor comprises:
   a dot product computation portion having a plurality of mixed-signal multiplier branches, each of the plurality of mixed-signal multiplier branches connected to a single common node, and each of the plurality of mixed-signal multiplier branches having a set of branch-dedicated switches and a single branch-dedicated capacitor where each branch has a different voltage level, the set including two switches connected in parallel, wherein the dot product computation portion further comprises:
   a common switch being external to each of the plurality of mixed-signal multiplier branches; and
   a first shared branch-external capacitor and a second shared branch-external capacitor positioned on opposed ends of the common switch, the first and the second shared branch-external capacitors being external to each of the plurality of mixed-signal multiplier branches such that only the first shared branch-external capacitor directly connects to the single common node connecting all of the plurality of mixed-signal multiplier branches,
   wherein various settings of the set of switches and the common switch enable various modes of the mixed-signal logic processor comprising a reset mode, a sample mode, a merge mode, and an accumulate mode for a dot product computation.

* * * * *